United States Patent
Naughton et al.

(10) Patent No.: US 10,669,636 B2
(45) Date of Patent: Jun. 2, 2020

(54) ALL SOLUTION-PROCESS AND PRODUCT FOR TRANSPARENT CONDUCTING FILM

(71) Applicants: Michael J. Naughton, Chestnut Hill, MA (US); Chaobin Yang, Brighton, MA (US); Kris Kempa, Chestnut Hill, MA (US); Michael J. Burns, Bedford, MA (US)

(72) Inventors: Michael J. Naughton, Chestnut Hill, MA (US); Chaobin Yang, Brighton, MA (US); Kris Kempa, Chestnut Hill, MA (US); Michael J. Burns, Bedford, MA (US)

(73) Assignee: The Trustees of Boston College, Chestnut Hill, MA (US)

( * ) Notice: Subject to any disclaimer, the term of this patent is extended or adjusted under 35 U.S.C. 154(b) by 274 days.

(21) Appl. No.: 15/455,762

(22) Filed: Mar. 10, 2017

(65) Prior Publication Data

US 2017/0261858 A1 Sep. 14, 2017

Related U.S. Application Data

(60) Provisional application No. 62/307,140, filed on Mar. 11, 2016.

(51) Int. Cl.

| | |
|---|---|
| G03F 7/095 | (2006.01) |
| C23C 18/38 | (2006.01) |
| H01B 1/02 | (2006.01) |
| C23C 18/42 | (2006.01) |
| C23C 18/16 | (2006.01) |
| C23C 18/52 | (2006.01) |
| G03F 7/11 | (2006.01) |
| B05D 1/32 | (2006.01) |
| G03F 7/40 | (2006.01) |

(52) U.S. Cl.
CPC .......... *C23C 18/38* (2013.01); *C23C 18/1605* (2013.01); *C23C 18/42* (2013.01); *C23C 18/52* (2013.01); *H01B 1/02* (2013.01); *B05D 1/327* (2013.01); *B05D 2201/02* (2013.01); *B05D 2203/35* (2013.01); *G03F 7/11* (2013.01); *G03F 7/40* (2013.01)

(58) Field of Classification Search
CPC ....... C23C 18/1605; B05D 1/327; G03F 7/11; G03F 7/095
See application file for complete search history.

(56) References Cited

U.S. PATENT DOCUMENTS 7,172,822 B2 2/2007 Shibata
2014/0326697 A1 11/2014 Carnahan et al.

OTHER PUBLICATIONS

Mastropietro, Mike; "Overview of transparent metal mesh electrode technologies;" 2015 DOE Solid-State Lighting R&D Workshop; Jan. 27-20, 2015; San Francisco, CA.
Kim, Won-Kyung et al., "Cu mesh for flexible transparent conductive electrodes," Scientific Reports, Jun. 3, 2015, vol. 5, pp. 10715-10722.
Fenn, John, "Other TCF materials," Fennagain, Nov. 2014, https://fennagain.wordpress.com/2014/11.
Li, Yaowen et al., "ITO-free photovoltaic cell utilizing a high-resolution silver grid current collecting layer," Solar Energy Materials & Solar Cells, available online Mar. 1, 2013, vol. 113, pp. 85-89, doi:10.1016/j.solmat.2013.01.043.
Han, Bing, et al., "Uniform solf-forming metallic network as a high-performance transparent conductive electrode," Advanced Materials, 2014, vol. 26, pp. 873-877, doi:10.1002/adma.201302950.
Rolith, Inc., "NanoWeb: submicron-transparent metal mesh conductors," accessed Mar. 9, 2016, www.rolith.com/applications/transparent-conductive-electrodes.
Fenn, John, "Other transparent conductive thin film candidates for use in touch panels," Fennagain, Aug. 26, 2014, https://fennagain.wordpress.com/2014/08/26/other-transparent-conductive-thin-film-candidates-for-use-in-touch-panels.

*Primary Examiner* — Daborah Chacko-Davis
(74) *Attorney, Agent, or Firm* — Bond, Schoeneck & King, PLLC; Joseph Noto

(57) ABSTRACT

An all solution-processed deposition includes a non-water soluble, non-self-cracking film deposited by a solution process (e.g., spray, dip, spin coat, and the like), a water soluble, self-cracking film deposited by a solution process (e.g., spray, dip, spin coat, and the like), cracking of the film, and filling the cracks with a metal that is deposited in solution (e.g., by electroless disposition). A transparent substrate having a cracked water insoluble, non-self-cracking film surface coating includes a plurality of fissures therein extending to and exposing portions of the surface of the underlying transparent substrate is useful for producing a transparent conducting film.

15 Claims, 15 Drawing Sheets

FIG. 9A
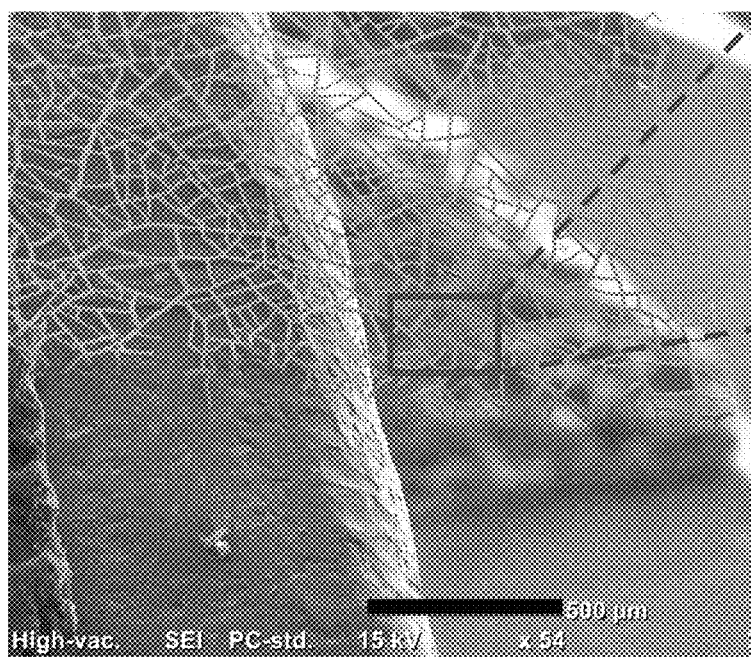
FIG. 9B
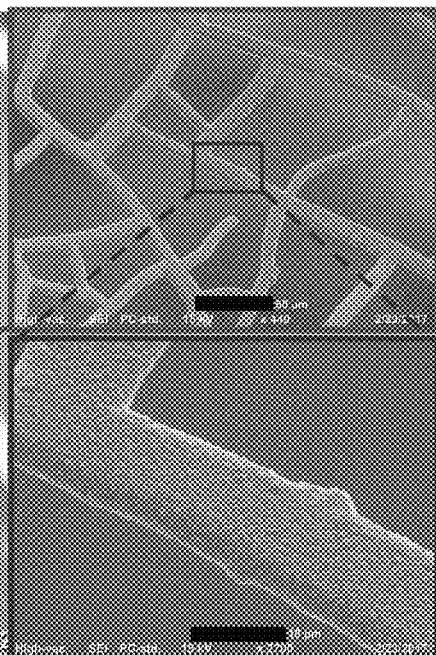
FIG. 9C

ALL SOLUTION-PROCESS AND PRODUCT FOR TRANSPARENT CONDUCTING FILM

CROSS REFERENCE

This application claims the benefit of the filing date of U.S. Provisional Patent Application Ser. No. 62/307,140, filed Mar. 11, 2016, which is hereby incorporated by reference in its entirety.

FIELD

The present disclosure is directed to an all solution-process for producing a cracked film coated transparent substrate and a transparent conducting film therefrom.

BACKGROUND

Materials with simultaneous high electrical conductivity and optical transmittance are essential for numerous optoelectronic devices, such as flat panel displays (TVs and computer monitors), touch screen displays (smart phones and tablets), thin film solar cells, light-emitting diodes and electromagnetic shielding. The predominant material used for such a transparent conductive electrode (TCE) is tin-doped indium oxide (ITO). ITO has optical transmittance greater than 80% in the visible spectrum, and so-called sheet resistance of about 10 ohm/square. Any other material or process that wishes to compete for TCE market share should reach or beat those metrics. There are two major reasons researchers are working to develop a replacement for ITO as a TCE: (1) ITO contains indium, a rare earth metal that is relatively rare and therefore expensive (about $1 per gram), as well as relatively brittle, limiting its use in flexible applications; and (2) fabrication of ITO and related TCE's requires vacuum-based deposition processes, such as physical vapor deposition (e.g. sputter deposition or thermal evaporation) or chemical vapor deposition. The cost of equipment for large scale implementation of these processes adds to the cost of the TCE, and thus to that of the end product.

There is ample evidence that an all solution-processed replacement for ITO is desired by many markets. The transparent conductive electrode, or transparent conductive film (TCF) market has been forecast to continue to reach over $5 billion by 2020.

Previously, one related process was described in which a film is applied to a substrate (typically a transparent substrate such as glass), the film is cracked by some process, and a conducting material (typically a metal) is deposited onto the cracked film. Some of that conducting material deposits into the voids created by the cracks, thus reaching the substrate. The next step, removing the initial film (which typically has the deposited conducting material on it), is intended to leave only the conducting material that had filled the cracks behind and attached to the substrate, thus forming a type of "metal mesh". This mesh can be both highly optical transmitting and highly electrically conducting, thus functioning as a TCE.

The art currently lacks a process for fabrication of a TCE that contains no indium and for which the deposition processes are all solution-based, addressing both major issues described above for the need to develop a replacement for ITO as a TCE.

SUMMARY

In accordance with one aspect of the present disclosure, there is provided a process for producing a transparent conducting film, including depositing a first solution on a surface of a transparent substrate, wherein the first solution is capable of forming a water insoluble, non-self-cracking film on the surface of the transparent substrate; solidifying the first solution to form a water insoluble, non-self-cracking film on the surface of the transparent substrate; depositing a second solution on the water insoluble, non-self-cracking film, wherein the second solution is capable of forming a water soluble, self-cracking film; solidifying the second solution to form a water soluble, self-cracking film on the water insoluble, non-self-cracking film, wherein the water soluble, self-cracking film cracks to provide a plurality of fissures therein which induce cracking in the water insoluble, non-self-cracking film to provide a plurality of fissures that penetrate at least a partial thickness of the water insoluble, non-self-cracking film, optionally, removing remaining non-cracked portions of the partial thickness of the water insoluble, non-self-cracking film, thereby exposing the underlying surface of the transparent substrate in the fissures; and applying a third solution including a metal on the exposed underlying surface of the transparent substrate which deposits the metal on the underlying surface of the transparent substrate; and removing the water insoluble, non-self-cracking film from the transparent substrate to produce a transparent conducting film.

In accordance with another aspect of the present disclosure, there is provided an article, including a transparent substrate; and a cracked water insoluble, non-self-cracking film coating a surface of the transparent substrate, the cracked water insoluble, non-self-cracking film having a plurality of fissures therein extending to and exposing the surface of the transparent substrate through the plurality of fissures.

These and other aspects of the present disclosure will become apparent upon a review of the following detailed description and the claims appended thereto.

BRIEF DESCRIPTION OF THE DRAWINGS

FIGS. 9A, 9B and 9C are SEM images at various magnifications of a free-standing silver mesh/network on a stainless steel support;

FIGS. 14C and 14F are cross-section view along green lines in FIGS. 14A and 14D.

DETAILED DESCRIPTION

Figure 1A:
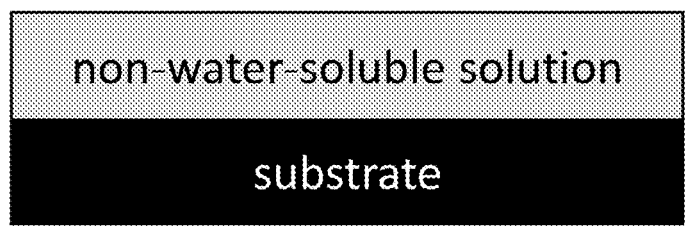
FIGS. 1A-1F is a schematic of an embodiment of a fabrication process for all-solution-processed transparent conducting electrode film.
Figure 1B:
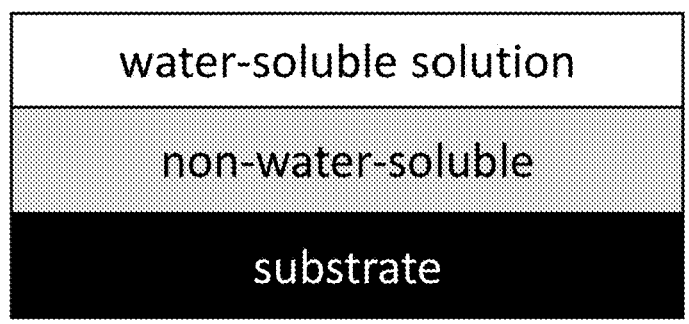
Figure 1C:
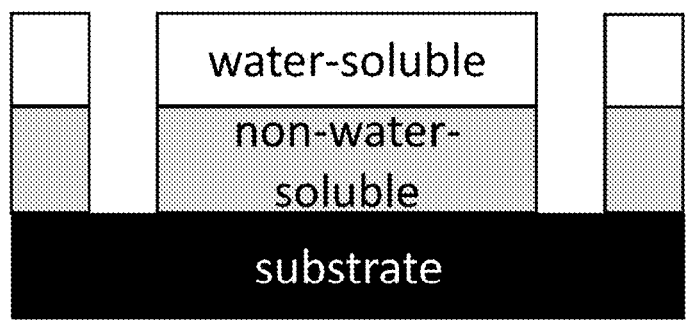
Figure 1D:
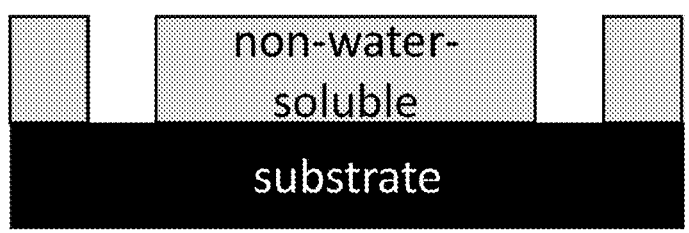
Figure 1E:
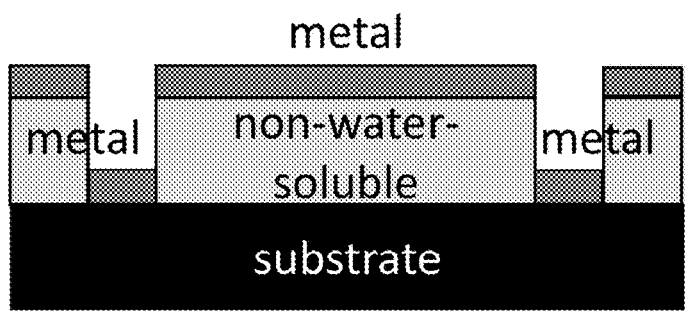
Figure 1F:
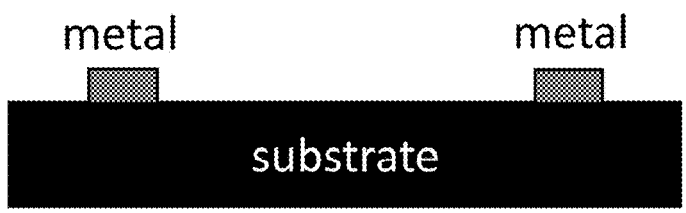
Figure 2A:
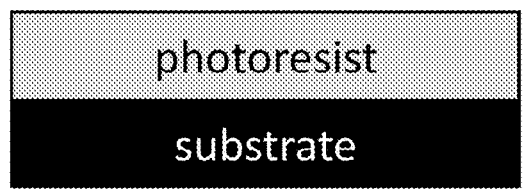
FIGS. 2A-2G is a schematic of one embodiment of a fabrication process for all-solution-processed transparent conducting electrode film.
Figure 2B:
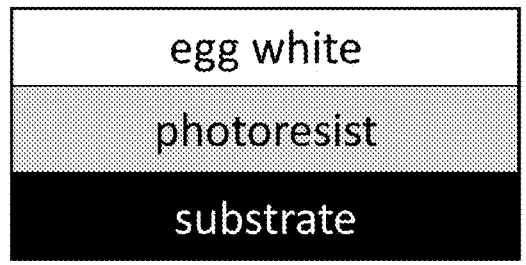
Figure 2C:
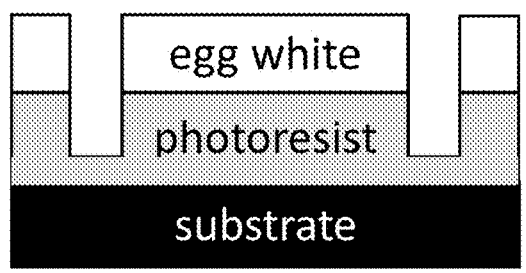
Figure 2D:
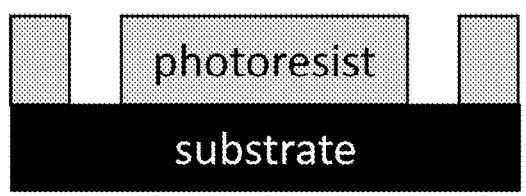
Figure 2E:
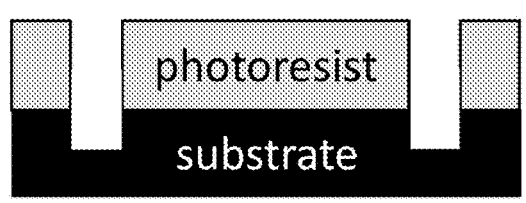
Figure 2F:
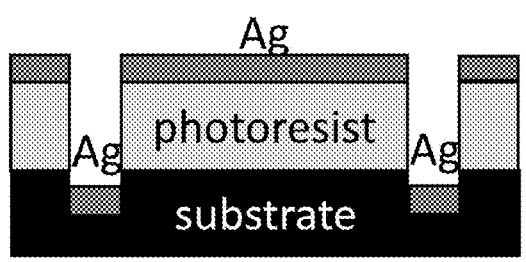
Figure 2G:

An embodiment of the present disclosure relates to an all solution-process for producing a transparent conducting film. A transparent conducting film is defined as a film that is both highly electrically conducting (sheet resistance at ambient temperature below approximately 100 ohm/square or volume resistivity below approximately $1\times10^{-5}$ ohm-m) and highly optically transparent (optical transmittance above 75% in the visible spectrum of nominal wavelength range 350 nm to 800 nm).

In an embodiment of a process for producing an all solution-processed transparent conducting film, a solution is deposited on a surface of a transparent substrate. Suitable transparent substrates include glasses and transparent polymers, such as polyethylene terephthalate (PET), polyethylene naphthalate (PEN), mylar, and Transphan® (a poly(bis(cyclopentadiene)). Suitable substrates may have the following properties: optical transparency in the visible spectrum above 75%, thickness between about 1 micrometer and about 1 millimeter, surface roughness between 1 nanometer and 1 micrometer, and be flexible or nonflexible. The solution which is capable of forming a water insoluble, non-self-cracking film on the surface of the substrate can include a photoresist material, which generally is a mixture of a resin, a solvent and a photoactive compound. Suitable solutions include common photoresist materials such as SU-8® by MicroChem Corp., Shipley Microposit® by Dow Chemical Co. and AZ® and TI® photoresists MicroChemicals GmbH. The solution can be deposited by a solution process (e.g., spray, dip, spin coat, Meyer rod coating, and the like).

The solution is solidified (e.g., by heating or drying without applying heat) to form a water insoluble, non-self-cracking film on the surface of the transparent substrate. A non-self-cracking film is a film which when placed on a substrate does not crack or form a network of cracks upon solidification by typical means, such a drying, heating or exposing to UV radiation).

A solution capable of forming a water soluble, self-cracking film is deposited on the non-self-cracking film. The solution contains water as solvent and micro-size particles as solute, which is capable of forming a water soluble, self-cracking film. Suitable solutions include egg white water solution, chicken collagen water solution, water based nail polish and $TiO_2$ water solution. The solution can be deposited by a solution process (e.g., spray, dip, spin coat, and the like).

The solution is solidified to form a water soluble, self-cracking film on the water insoluble, non-self-cracking film. A self-cracking film is a film on a substrate that spontaneously cracks or forms a network of cracks or fissures upon solidification by typical means, such a drying, heating.

The solidified water soluble, self-cracking film cracks to provide a plurality of fissures therein and induces cracking in the underlying water insoluble, non-self-cracking film wherein the plurality of fissures penetrate a full or partial thickness of the water insoluble, non-self-cracking film to expose the underlying surface of the transparent substrate in at least a portion of the fissures. The solution can be solidified by drying with or without heat.

In the case of the plurality of fissures penetrating a partial thickness of the water insoluble, non-self-cracking film, the plurality of fissures that penetrate the partial thickness of the water insoluble, non-self-cracking film is extended by removing the remaining non-cracked portion of the partial thickness of the water insoluble, non-self-cracking film to expose the underlying surface of the transparent substrate in these fissures. A method for removal of the partial thickness of the non-self-cracking film is to expose the sample to UV light. The water-soluble, self-cracking film blocks UV for most parts of the water-insoluble, non-self-cracking layer which is UV sensitive. Because the exposed partial thickness of the non-self-cracking photoresist under the plurality of fissures is not covered by self-cracking materials, it will get illuminated by the UV light and become developer-soluble. The sample is placed in a developer solution of the corresponding non-cracking photoresist that removes the remaining partial thickness material.

The water-insoluble, non-self-cracking layer can be made by other non-photo-sensitive polymer, for example CYTOP®. In this case partial thickness of non-self-cracking layer below the plurality of fissures can be removed by plasma etching because it is not covered by a water-soluble mask.

The resultant transparent substrate having a cracked water insoluble, non-self-cracking film surface coating including the plurality of fissures therein extending to and exposing portions of the surface of the underlying transparent substrate is useful for producing a transparent conducting film.

A solution containing a metal is applied to the surface of the cracked water insoluble, non-self-cracking film which deposits the metal in the plurality of fissures on the exposed underlying surface of the substrate and on the remaining surface of the cracked water insoluble non-self-cracking film. Suitable metals include (e.g., silver, copper, and zinc). The metal-containing solution can be applied by e.g., electroless disposition. Typically, the water soluble, self-cracking film is removed during metal deposition, e.g., by electroless disposition or in a latter step when developer is used.

The cracked non-self-cracking film is removed from the transparent substrate (a process generally known as "lift-off"), which accordingly removes the metal deposited on the surface of the film, to produce a transparent conducting film. Methods for removal of the non-self-cracking film include dissolve it in organic solution (e.g., acetone, 1165 and chloroform) and mechanical wiping. Ultrasonic vibration may be used during this lift-off process. Silver metal dimensions may be varied (thickness, width related to crack width) and segment length, related to crack density. Then the present and any future materials and processes will be utilized in research on flexible substrates, such as PET and PEN. Further processing includes electroplating silver over the electroless deposited silver wires.

FIGS. 1A-1F is a schematic of an embodiment of a fabrication process for all-solution-processed transparent conducting electrode film. The process includes (FIG. 1A) Deposit film of non-water-soluble solution on transparent substrate, (FIG. 1B) Deposit film of water-soluble solution, (FIG. 1C) Solidify films in order to crack solidified water-soluble film, which transfers cracks to solidified non-watersoluble film, (FIG. 1D) Non-water-soluble patterns, (FIG. 1E) Solution-deposit metal, and (FIG. 1F) Lift off.

FIGS. 2A-2G is a schematic of one embodiment of a fabrication process for all-solution-processed transparent conducting electrode film. The process includes (FIG. 2A) Deposit photoresist on transparent substrate, (FIG. 2B) Deposit egg white solution, (FIG. 2C) Bake to crack egg white and part or all of photoresist, (FIG. 2D) UV expose and develop photoresist, (FIG. 2E) Wet etch substrate, (FIG. 2F) Electrolessly deposit silver, and (FIG. 2G) Lift off photoresist.

Figure 3:
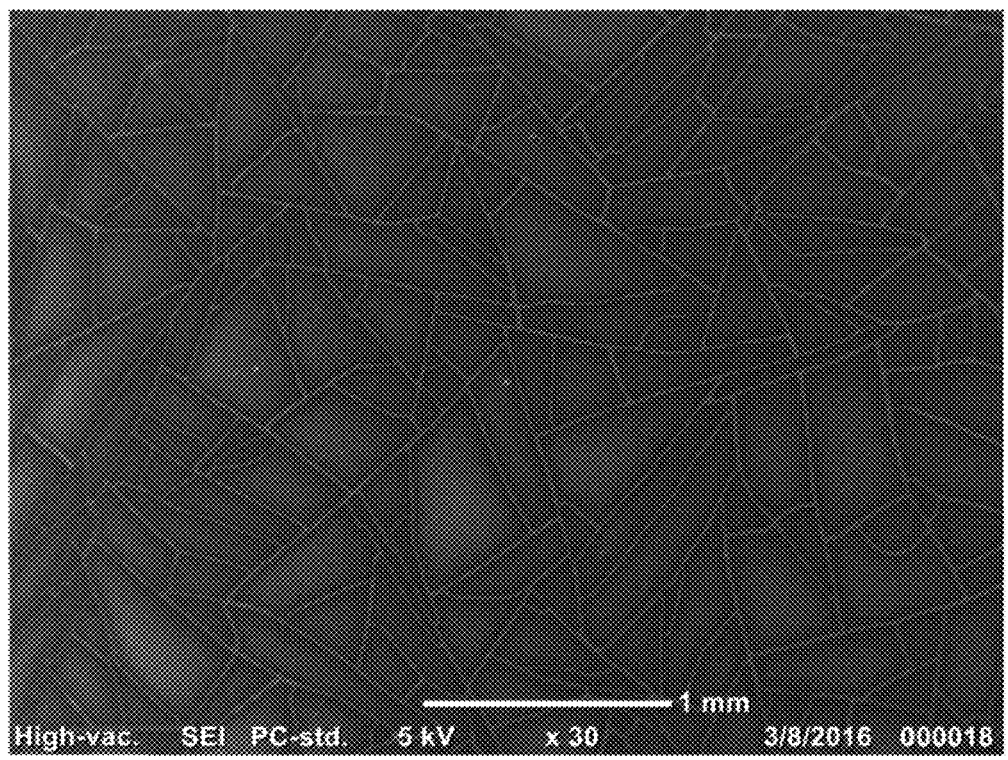
FIG. 3 is an electron microscope image of a completed TCF.

FIG. 3 is an electron microscope image of a completed TCF, showing Ag microwire network/mesh on glass substrate.

Figure 4:
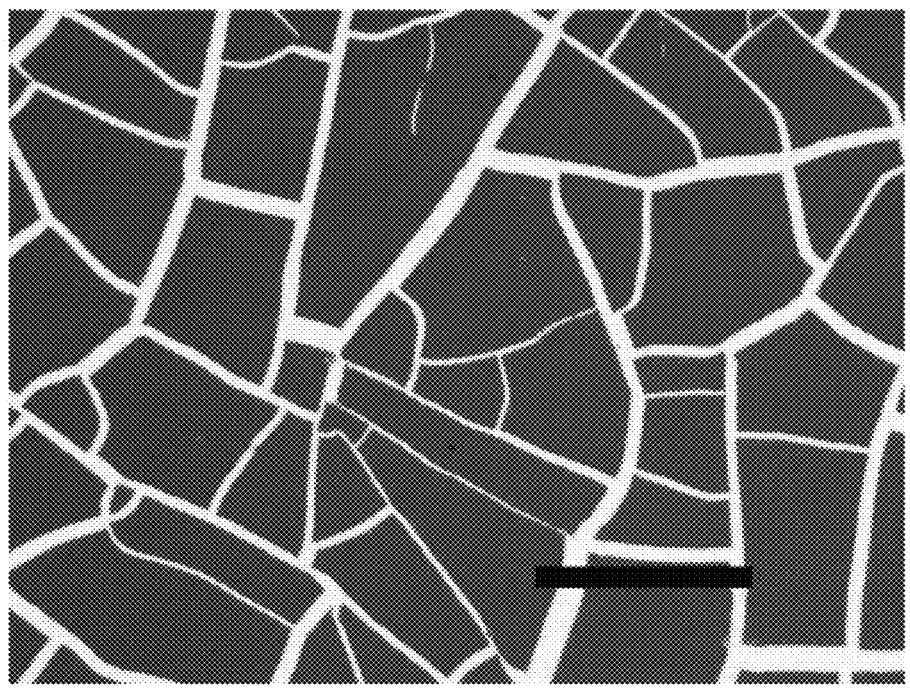
FIG. 4 is an optical microscope image of a completed TCF.

FIG. 4 is an optical microscope image of a completed TCF, showing Ag microwire network/mesh on glass substrate.

Figure 5:
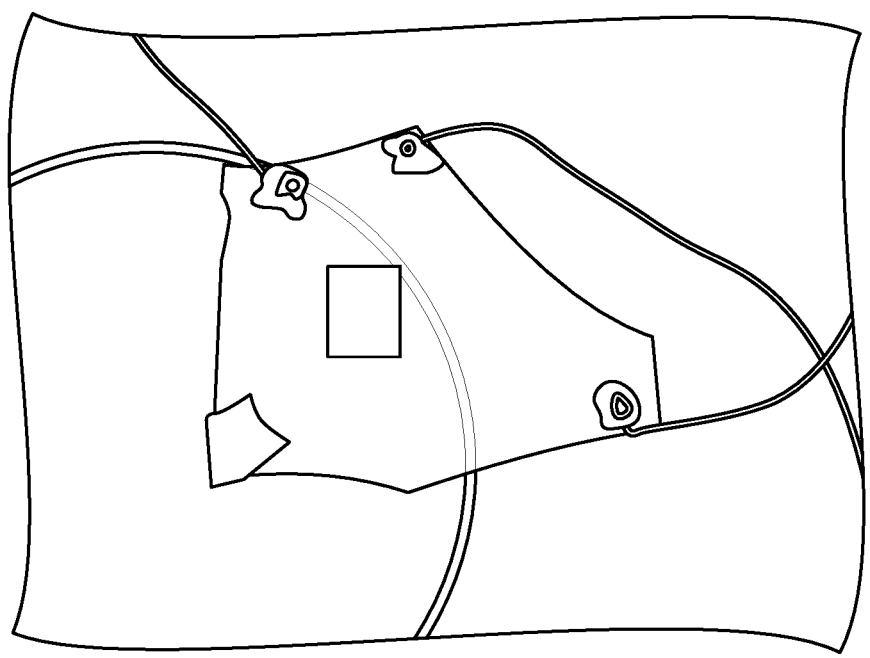
FIG. 5 is a photograph of a piece of a Ag mesh TCF with resistance-measurement electrodes attached.

FIG. 5 is a photograph of a piece of a Ag mesh TCF about 1.5 $cm^2$ in area, with resistance-measurement electrodes attached, placed above an image that provides a view of the optical transparency, black regions are pieces of adhesion tape.

Figure 6:
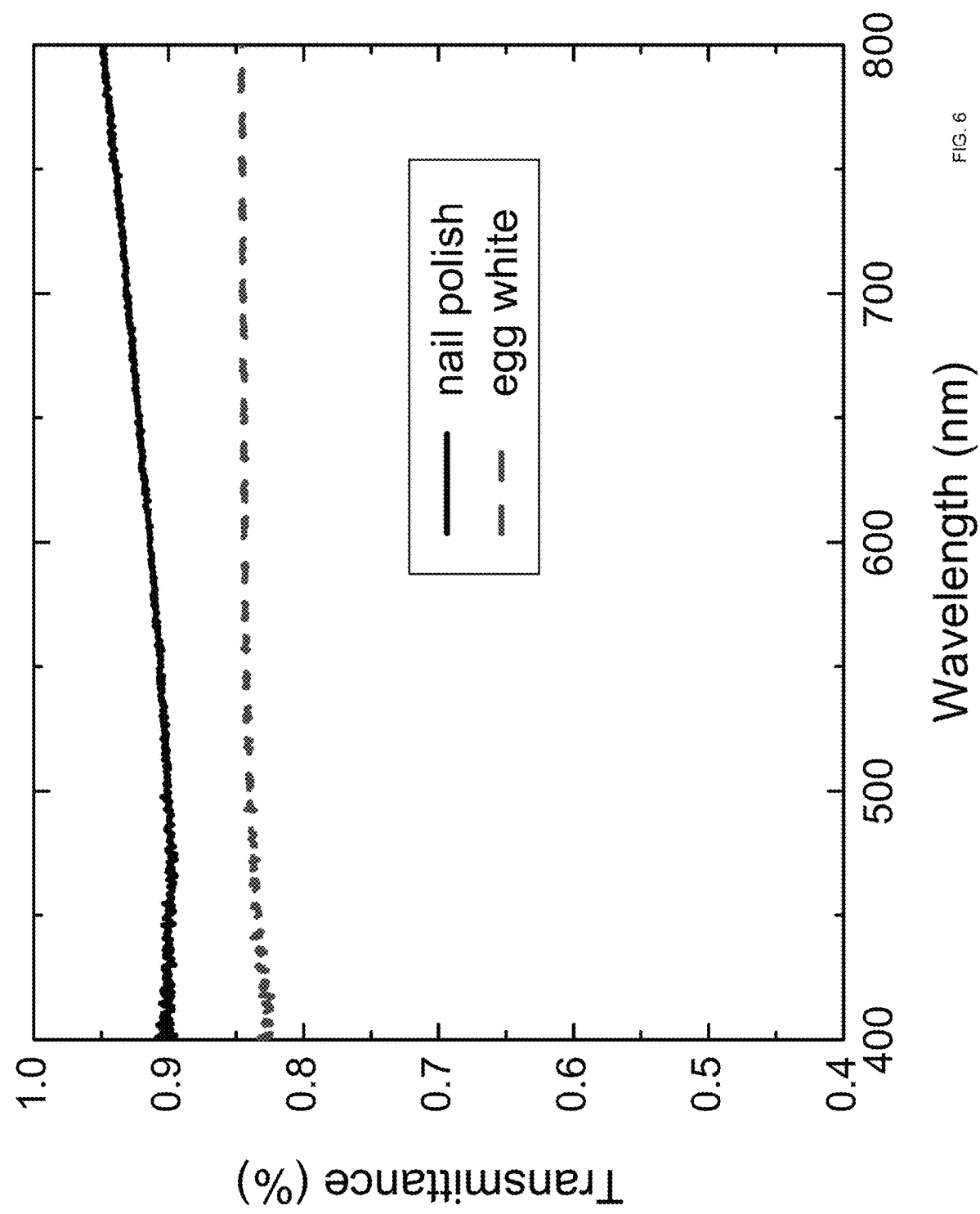
FIG. 6 is a graph of optical transmittance vs. wavelength for Ag-based TCFs.

FIG. 6 is a graph of optical transmittance vs. wavelength in the visible and near-infrared regions (400 nm to 800 nm) of the spectrum for Ag-based TCFs prepared with the egg white process (black solid line, showing transmittance between 90% and 95%), and with the nail polish process (red dashed line, showing transmittance between 83% and 85%).

Figure 7:
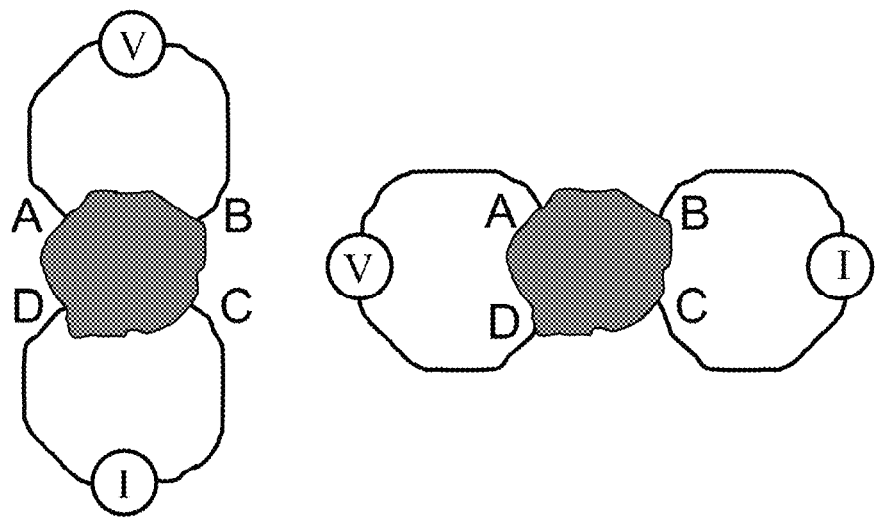
FIG. 7 is a schematic of sheet resistance measurement and equation.

FIG. 7 is a schematic of sheet resistance measurement and equation for calculating sheet resistance based on individual resistance measurements.

Figure 8A:
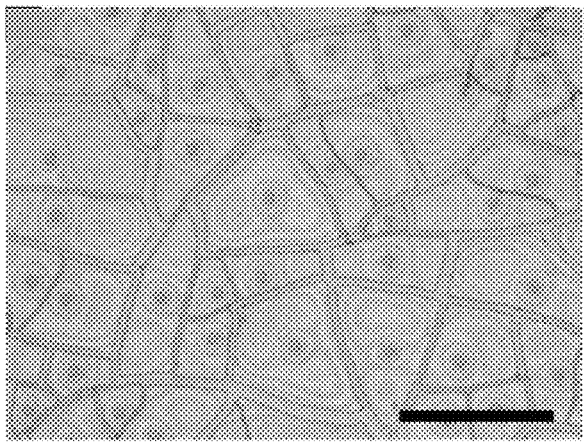
FIGS. 8A, 8B, 8C, and 8D are four optical microscope images of three stages of preparation of a cracked network TCF.
Figure 8B:
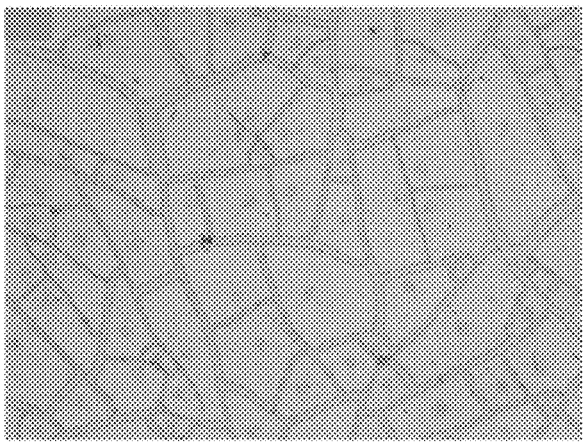
Figure 8C:
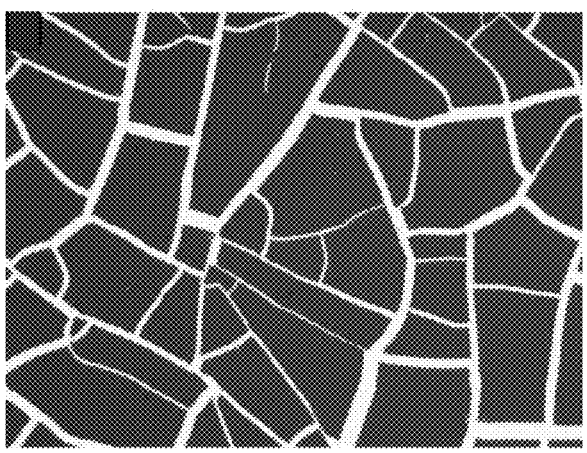
Figure 8D:
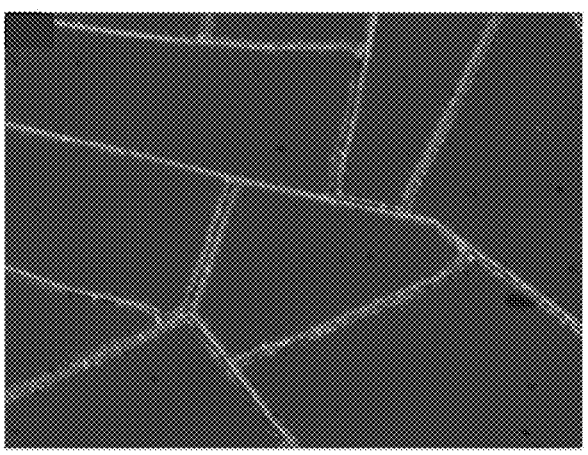

FIGS. 8A-8D shows four optical microscope images of three stages of preparation of a cracked network TCF. FIG. 8A Cracked nail polish on photoresist on glass; FIG. 8B Cracked photoresist (after removal of cracked nail polish) on glass; FIG. 8C Ag network TCF on glass, made by nail polish process; FIG. 8D Ag network TCF on glass, made by egg white process. Scale bar in (a), pertaining to all four images, is 200 μm.

FIGS. 9A-9C shows a SEM images at various magnifications of a free-standing silver mesh/network on a stainless steel support. Scale bars: FIG. 9A is 500 μm, FIG. 9B is 50 μm, FIG. 9C is 10 μm.

Figure 10A:
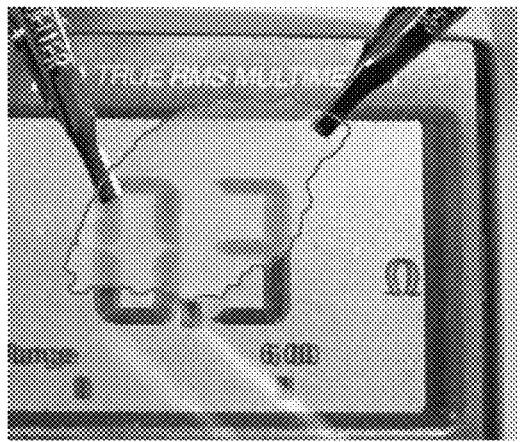
FIG. 10A is a photograph of a piece of a Ag mesh TCF with resistance-measurement electrodes attached.
Figure 10B:
FIG. 10B is a photograph of a 100 mm-diameter glass substrate coated with a Ag mesh TCF.

FIG. 10A is a photograph of a piece of a Ag mesh TCF about 1 $cm^2$ in area, with resistance-measurement electrodes attached, placed above the digital readout of a resistance meter, showing high conductance (i.e., low resistance of 0.3 ohm) and high optical transparency; and FIG. 10B is a photograph of a 100 mm-diameter glass substrate coated with a Ag mesh TCF placed in front of a building, showing high optical transparency.

Figure 11:
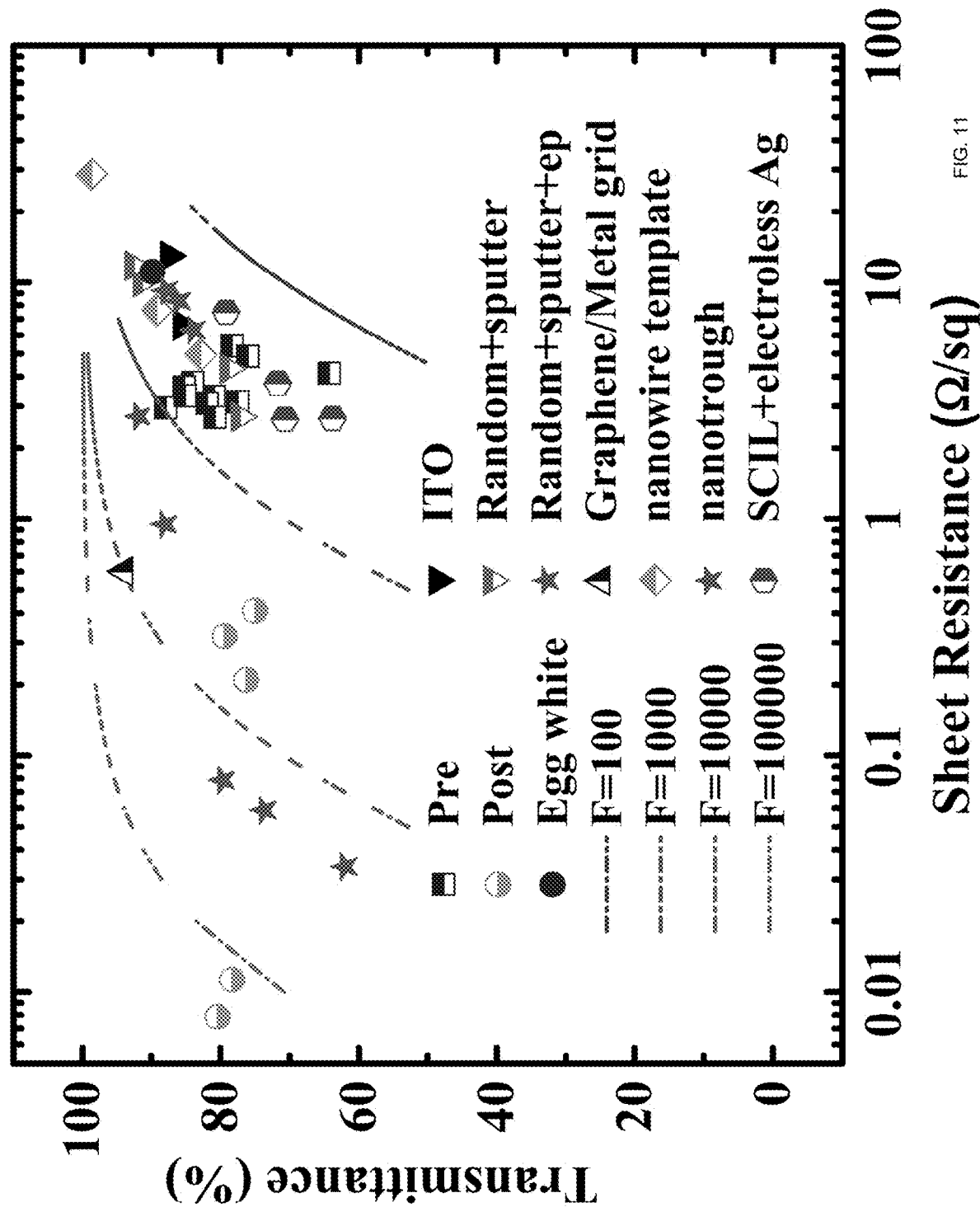
FIG. 11 is a graph of transmittance vs. sheet resistance of TCFs before and after electroplating.

FIG. 11 is a graph of transmittance vs. sheet resistance of completed TCFs before (Pre: half-filled blue squares) and after (Post: half-filled orange circles) electroplating. Results from other approaches are also included for comparison. Definition of figure of merit, F, considers both transmittance and sheet resistance which shows that after electroplating the sample has best performance among literatures.

Figure 12C:
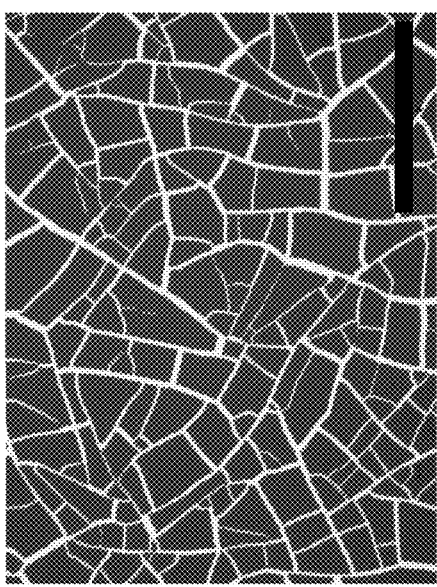
FIGS. 12A, 12B, 12C, 12D, 12E and 12F are six optical microscope images of TCFs.
Figure 12B:
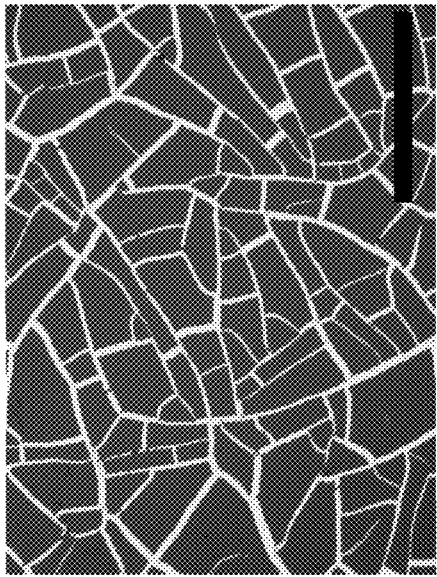
Figure 12A:
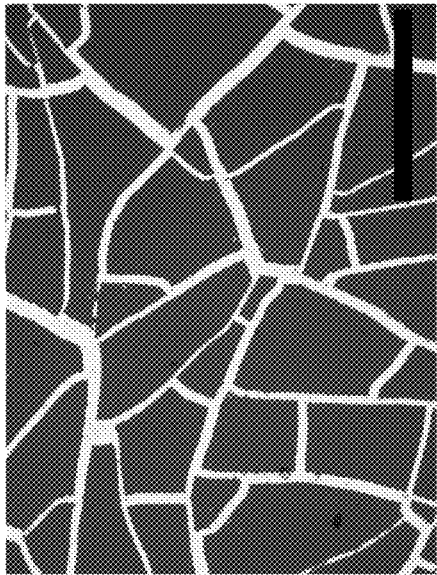
Figure 12F:
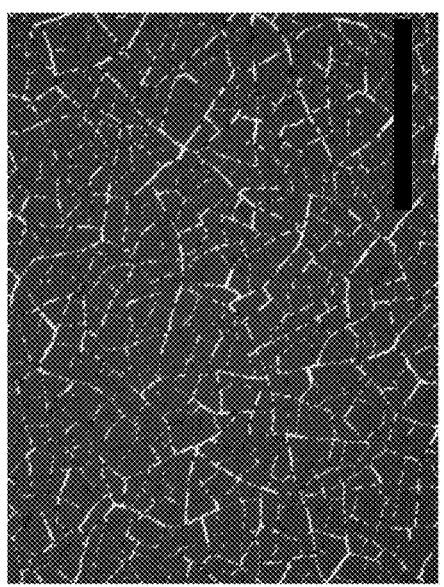
Figure 12E:
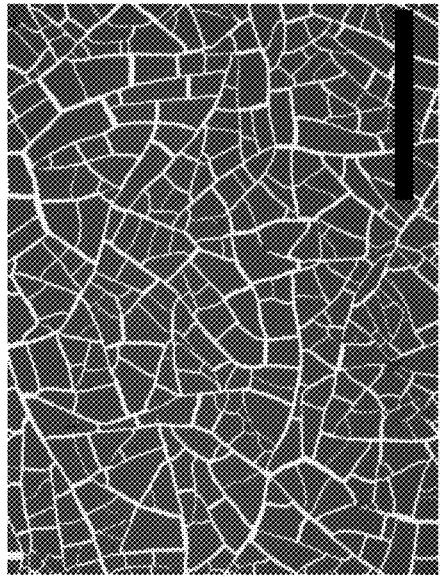
Figure 12D:
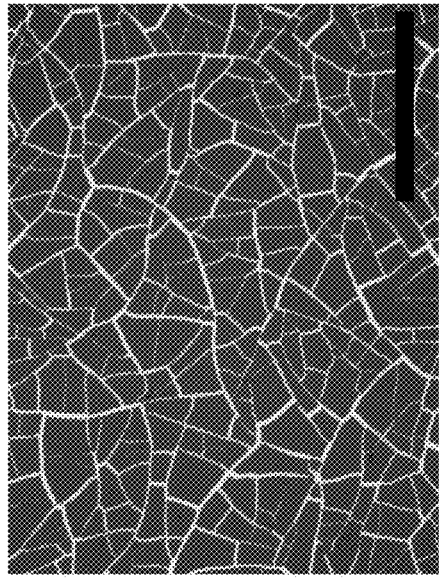

FIGS. 12A-12F shows six optical microscope images of completed TCFs made by nail polish. The difference of domain size orients from various spin speed of nail polish. Spin speed and averaged domain size, respectively are: FIG. 12A 1000 rpm, 215.4 um; FIG. 12B 2000 rpm, 123.3 um; FIG. 12C 3000 rpm, 98.4 um; FIG. 12D 4000 rpm, 87.4 um; FIG. 12E 5000 rpm, 68.5 um; FIG. 12F 6000 rpm, 54.5 um. Scale bars in all six images are 200 μm.

Figure 13:
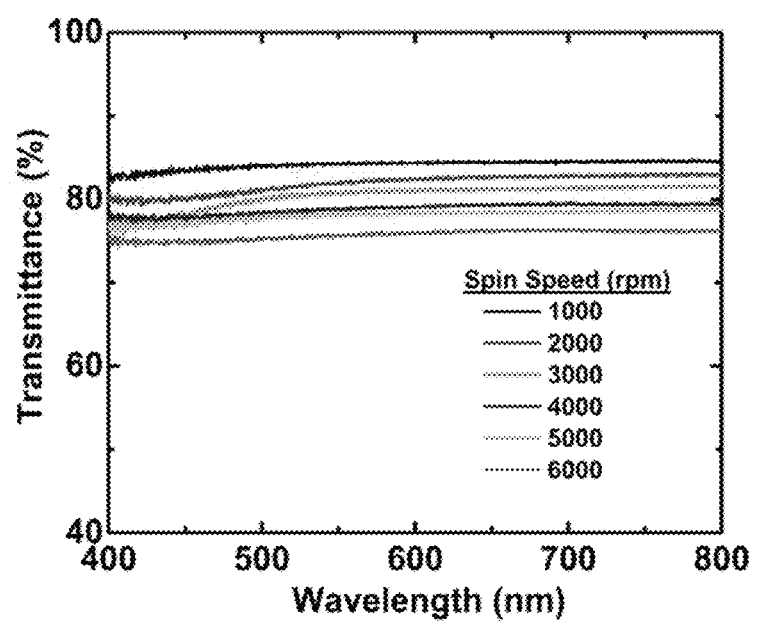
FIG. 13 is a graph of transmittance vs. wavelength of the samples shown in FIGS. 12A-12F.

FIG. 13 is a graph of transmittance vs. wavelength of samples shown in FIGS. 12A-12F.

Figure 14A:
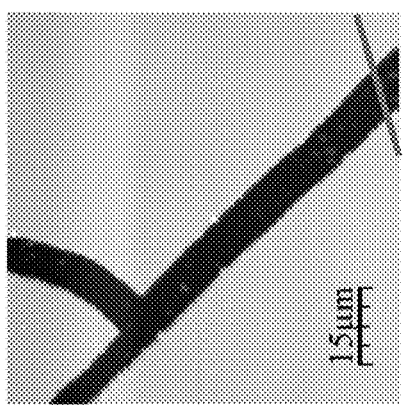
FIGS. 14A-14F shows atomic force microscope (AFM) images of completed samples pre-electroplating (FIGS. 14A and 14B) and post-electroplating (FIGS. 14D and 14E).
Figure 14B:
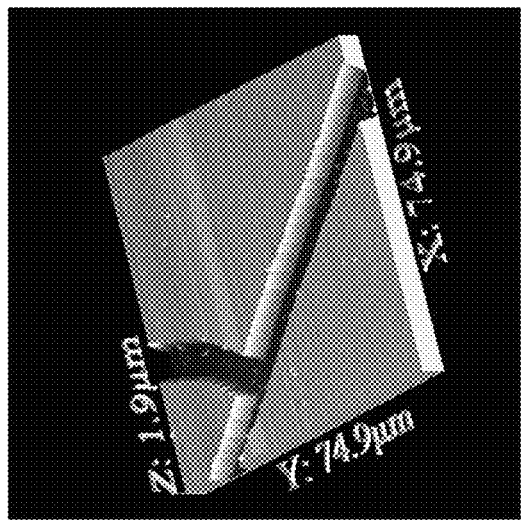
Figure 14C:
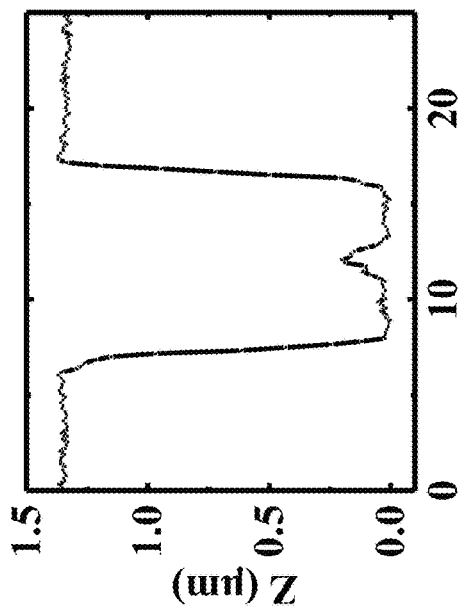
Figure 14D:
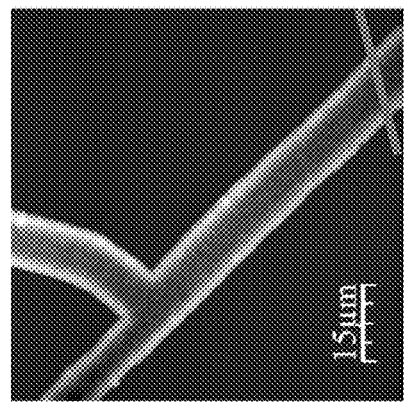
Figure 14E:
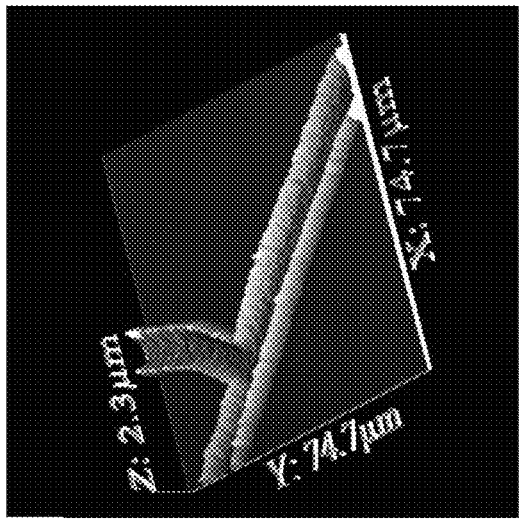
Figure 14F:
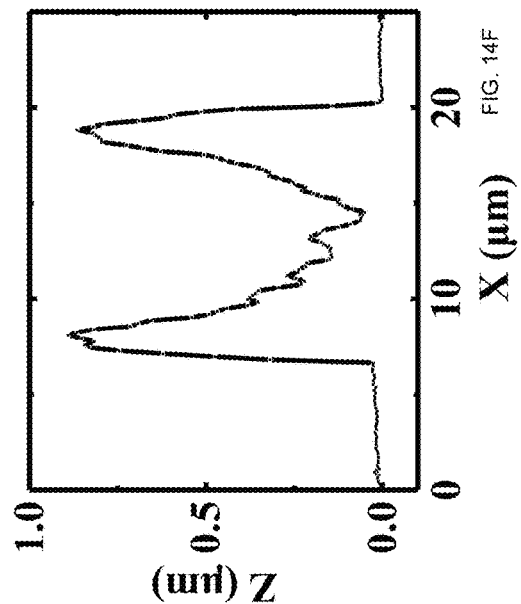

FIGS. 14A-14F shows Atomic Force Microscope (AFM) images of completed samples pre-electroplating (FIGS. 14A and 14B) and post-electroplating (FIGS. 14D and 14E). FIGS. 14C and 14F are cross-section view along green lines in FIGS. 14A and 14D, separately.

Figure 15:
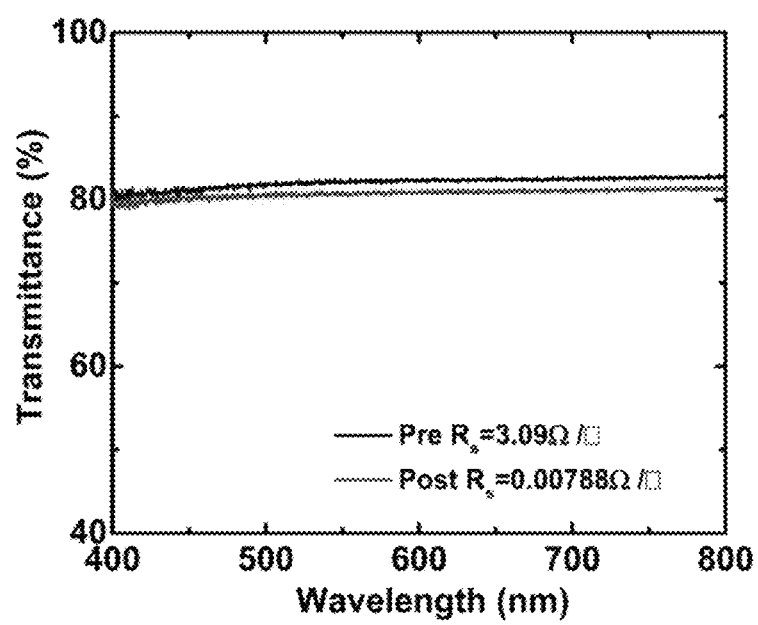
FIG. 15 is a graph of transmittance vs. sheet resistance of the Ag network films shown in FIGS. 14A-14F.

FIG. 15 is a graph of transmittance vs. sheet resistance of completed samples pre- and post-electroplating of the Ag network films shown in in FIGS. 14A-14F.

An important feature includes the all solution-processed deposition. In particular, a non-water soluble, non-self-cracking film is deposited by a solution process (e.g., spray, dip, spin coat, etc.), the film is cracked, and a metal that fills the cracks is deposited in solution (e.g., by electroless disposition). In a specific embodiment, a 2-layer film applied to a glass substrate was used, the first layer is water insoluble and typically not crackable upon solidification and the second layer is water soluble and typically crackable upon solidification. Upon air drying or application of heat, the $2^{nd}$ layer cracks, and this cracking penetrates into, or is transferred to, the $1^{st}$ layer, cracking it accordingly. Egg white was used as a $2^{nd}$ layer, deposited over photoresist as the $1^{st}$ layer. It is presumed that the albumin protein in the egg white polymerizes under heat (as in cooking an egg), and this polymerization leads to shrinkage, which in turn leads to cracking. Water-based nail polish is another kind of $2^{nd}$ layer material. The importance of the 2-layer structure lies in the fact that the subsequent solution-based metal deposition, e.g., electroless deposition of metal (e.g., silver), is done in an aqueous environment in which polymerized egg-white/nail polish dissolves but the photoresist does not. The present disclosure illustrates the benefits of egg white/nail polish plus photoresist to subsequent solution-processed metal deposition. Thus, the cracked surface structure remains in place during the silver metal deposition.

The present disclosure relates to the fabrication of a transparent conducting electrode film that contains no indium and for which the deposition processes are all solution-based. An important aspect is the use of a self-cracking film that is not water soluble, such that it is stable in an aqueous-based solution for electroless deposition of metal.

Heating the glass plus a water-insoluble film plus a water-soluble film leads to cracking of the water-soluble film which in turns causes coordinated cracking of the water-insoluble film. In the embodiment where the water-insoluble film is a photoresist, subsequent exposure of the sample to ultraviolet light partially decrosslinks the portion of the positive photoresist (or crosslinks for negative photoresist) that lies in the cracked regions, such that those parts of the exposed photoresist can be washed away, leaving exposed substrate for subsequent electroless deposition of metal.

An advantage of the present invention lies in the all solution-processed deposition. In the present invention, the above process of heating a double layer of egg white on photoresist led to cracking of the full thickness of the egg white, but cracking of only partial thickness of the photoresist. As such, an ultraviolet exposure was performed that converted the portions of the photoresist at the bottom of the cracked regions to a condition that was soluble in photoresist developer. Importantly, this exposure does not convert the photoresist not in the crack regions to this soluble condition.

Alternatively, it is possible to enact the above photoresist solubility conversion by performing a plasma etch, but this process is not "wet" or "solution-based" as it requires a vacuum chamber.

Alternatively, it is possible to enact the above photoresist solubility conversion by performing a "wet etch", a process that is solution-based as it does not require a vacuum chamber.

Adhesion of electrolessly-deposited metal (e.g. silver) can be aided by a "wet etch" or "solution-based etch" of the exposed glass surface with, e.g., buffered oxide etch (typically 6:1 volume ratio of 40% $NH_4F$ in water to 49% HF in water), prior to silver deposition. The 1st layer photoresist is also stable during this etch, whereas the 2nd layer egg white is not. Once metal deposition is complete, the cracked photoresist layer is removed by a "lift-off" process (washing in acetone), leaving behind a connected network of silver microwires. The small width of these microwires, approximately 0.1 to 10 μm, is important for small area coverage, leading to high optical transparency, while the physical connectedness of the network is important for electrical continuity across the network. The electrical resistivity (and thus the so-called sheet resistance) of the silver network is desired to be small, and is controlled by the width and thickness of the silver wires, as well as the length of an electrical path through the network.

Although various embodiments have been depicted and described in detail herein, it will be apparent to those skilled in the relevant art that various modifications, additions, substitutions, and the like can be made without departing from the spirit of the disclosure and these are therefore considered to be within the scope of the disclosure as defined in the claims which follow.

What is claimed:

1. A process for producing a transparent conducting film, comprising:
    depositing a first solution on a surface of a substrate;
    solidifying the first solution to form a water insoluble, non-self-cracking film on the surface of the substrate;
    depositing a second solution on the water insoluble, non-self-cracking film;
    solidifying the second solution to form a water soluble, self-cracking film on the water insoluble, non-self-cracking film, wherein the water soluble, self-cracking film cracks to provide a plurality of fissures therein exposing portions of the underlying water insoluble, non-self-cracking film;
    illuminating with UV light the exposed portions of the water insoluble, non-self-cracking film;
    removing the UV illuminated portions of the water insoluble, non-self-cracking film exposing the underlying surface of the substrate in the fissures;
    applying a third solution comprising a metal on the exposed underlying surface of the substrate which deposits the metal on the underlying surface of the substrate forming a connected metal network directly on the substrate; and
    removing the water insoluble, non-self-cracking film from the substrate yielding a transparent conducting film comprising the connected metal network.

2. The process of claim 1, wherein the first solution comprises a solution of a thermopolymer or photopolymer.

3. The process of claim 2, wherein the solution of a photopolymer comprises a photoresist.

4. The process of claim 1, wherein the water insoluble, non-self-cracking film comprises a photoresist.

5. The process of claim 1, wherein solidifying the first solution comprises heating or drying without heat.

6. The process of claim 1, wherein the first solution is deposited by a spray, dip, or spin coat process.

7. The process of claim 1, wherein the second solution comprises a solution of egg white and water, chicken collagen and water, $TiO_2$ and water, or a water-based nail polish.

8. The process of claim 1, wherein solidifying the second solution comprises heating or drying without heat.

9. The process of claim 1, wherein the water soluble, self-cracking film comprises polymerized egg white, polymerized chicken collagen, $TiO_2$ or polymerized nail polish.

10. The process of claim 1, wherein the second solution is deposited by a spray, dip, or spin coat process.

11. The process of claim 1, wherein the third solution comprises an electroless plating solution.

12. The process of claim 11, wherein the electroless plating solution comprises silver, copper, or zinc.

13. The process of claim 1, wherein the substrate comprises a transparent substrate.

14. The process of claim 13, wherein the transparent substrate comprises glass or a transparent polymer.

15. The process of claim 14, wherein the transparent polymer comprises polyethylene terephthalate, polyethylene naphthalate, mylar, poly(bis(cyclopentadiene)) condensate material, and colorless polyimide.

* * * * *